(12) United States Patent
Nam et al.

(10) Patent No.: US 6,522,197 B2
(45) Date of Patent: Feb. 18, 2003

(54) METHOD AND APPARATUS FOR OPTIMUM BIASING OF CASCADED MOSFET RADIO-FREQUENCY DEVICES

(75) Inventors: Ki Y. Nam, Laguna Niguel, CA (US); Thinh Dat Do, Fountain Valley, CA (US)

(73) Assignee: Paradigm Wireless Systems, Inc., Irvine, CA (US)

( * ) Notice: Subject to any disclaimer, the term of this patent is extended or adjusted under 35 U.S.C. 154(b) by 15 days.

(21) Appl. No.: 09/746,440

(22) Filed: Dec. 21, 2000

(65) Prior Publication Data

US 2002/0005755 A1 Jan. 17, 2002

Related U.S. Application Data

(60) Provisional application No. 60/199,372, filed on Apr. 21, 2000.

(51) Int. Cl.[7] .............................. H03G 9/00; H03G 3/10; H03F 1/26
(52) U.S. Cl. ..................... 330/133; 330/149; 330/278
(58) Field of Search ................................. 330/133, 149, 330/278

(56) References Cited

U.S. PATENT DOCUMENTS

| | | |
|---|---|---|
| 3,729,687 A | 4/1973 | Orlandini et al. |
| 3,789,309 A | 1/1974 | Embley |
| 4,081,757 A | 3/1978 | Rumbaugh |
| 4,540,953 A | 9/1985 | Togari et al. |
| 4,553,105 A | 11/1985 | Sasaki |
| 4,598,252 A | 7/1986 | Andricos |
| 4,629,996 A | 12/1986 | Watanabe et al. |
| 5,027,410 A * | 6/1991 | Williamson et al. ........ 381/314 |
| 5,105,167 A | 4/1992 | Peczalski |
| 5,451,907 A | 9/1995 | Keane et al. |
| 5,471,656 A | 11/1995 | Kusunoski |
| 5,532,646 A | 7/1996 | Aihara |
| 5,598,127 A * | 1/1997 | Abbiati et al. ............... 330/149 |
| 5,745,857 A | 4/1998 | Maeng et al. |
| 5,793,253 A | 8/1998 | Kumar et al. |
| 5,794,187 A * | 8/1998 | Franklin et al. ............. 381/316 |
| 5,872,481 A | 2/1999 | Sevic et al. |
| 5,889,434 A | 3/1999 | Shimura et al. |
| 5,990,746 A | 11/1999 | Samuels |
| 6,054,895 A * | 4/2000 | Danielsons et al. ......... 330/149 |
| 6,072,364 A * | 6/2000 | Jeckeln et al. ............... 330/149 |

FOREIGN PATENT DOCUMENTS

| | | |
|---|---|---|
| EP | 0481741 A2 | 4/1992 |
| EP | 06310949 | 4/1994 |
| EP | 0854569 A1 | 7/1998 |
| EP | 0878904 A2 | 11/1998 |
| EP | 0952666 A2 | 10/1999 |
| EP | 0987817 A1 | 3/2000 |
| JP | 02000183663 A * | 6/2000 |

* cited by examiner

*Primary Examiner*—Patricia T. Nguyen
(74) *Attorney, Agent, or Firm*—Blakely, Sokoloff, Taylor & Zafman LLP

(57) ABSTRACT

Generally, the invention relates to a method and apparatus to improve the performance of multi-stage radio frequency linear power amplifiers. More particularly, the present invention discloses a cascaded gain expansion stage and gain compression stage at differing bias levels to produce an amplifier with superior linearity and lower intermodulation distortion and adjacent channel power than any single stage by alone.

21 Claims, 8 Drawing Sheets

Quiescent Current vs. Bias Voltage

| Bias Voltage | Quiescent Current |
|---|---|
| 3.0 VDC | 155 mA |
| 3.2 VDC | 285 mA |
| 3.4 VDC | 440 mA |
| 3.6 VDC | 620 mA |

FIG. 2

METHOD AND APPARATUS FOR OPTIMUM BIASING OF CASCADED MOSFET RADIO-FREQUENCY DEVICES

RELATED APPLICATION

This application claims the benefit of U.S. Provisional Patent Application No. 60/199,372 filed on Apr. 21, 2000.

FIELD

The present invention relates generally to power amplifier systems, and more particularly to a method and apparatus to improve the linear performance of radio-frequency power amplifiers.

BACKGROUND OF THE INVENTION

Communication services providers, such as cellular system operators, are subject to very strict bandwidth usage spectrum constraints imposed by the Federal Communications Commission (FCC). The FCC licenses transmission channels in the radio frequency spectrum and requires that signals be confined within certain emission limit masks in order to prevent interference caused by signals straying or spilling into adjacent transmission channels. The "emission mask" is a power spectrum density envelope. The maximum emitted power allowed varies as a function of the frequency offset from the nominal allocation center frequency. In other words, the emission mask determines the maximum power which may be emitted at a specific frequency for each frequency within the channel allocation. This requires that sideband spillover, the amount of energy outside the licensed channel, be sharply attenuated.

Meeting these emission mask requirements is specially difficult when implementing modern, digitally-based, modulation formats, such as Code Division Multiple Access (CDMA), or Time Division Multiple Access (TDMA). Attenuating the sidebands to meet FCC requirements using such modulation requires very linear signal processing systems and components. Additionally, these digital modulation formats generally require very high peak power in relation to average power levels. In almost every power amplifier design, some kind of linearity augmentation is utilized. Thus, designing linear components, and in particular power amplifiers, at radio frequencies is costly and challenging to achieve.

Radio-frequency (RF) linear power amplifiers (LPA), comprising a plurality of RF power transistors, are typically used in digital cellular base stations to boost the power of a transmitted signal. RF power amplifiers for cellular communications typically operate in the Megahertz (MHz) and Gigahertz (GHz) frequency regions. Boosting a transmitted signal usually requires a LPA with a high ratio of peak-to-average power output (dynamic headroom), typically of at least 10 dB. The challenge is to design LPAs which can provide such dynamic headroom while minimizing sideband spillover without distorting the boosted signal.

A typical cellular base station requires the overall gain of its LPA to be in the 45 to 60 decibel (dB) range. Some of this gain is achieved by designing an LPA with cascading RF power transistors, with each series of transistors known as a "gain stage". A fundamental problem in designing linear RF power amplifiers is that power amplifiers are inherently non-linear devices and generate unwanted intermodulation distortion (IMD).

Linearity refers to a characteristic of power amplifiers where there is a substantially constant (linear) gain between an input signal and an output signal. Typically, power amplifiers only exhibit linear gain within a range of input signal voltage levels. This range is often called the linear region of the power amplifier. If the input signal voltage is below the minimum voltage for the linear region or above the maximum voltage for the linear region, then distortion of the signal occurs.

Another form of signal distortion, known as intermodulation distortion, manifests itself as spurious signals in the amplified RF output signal, separate and distinct from the RF input signal. IMD occurs when different frequencies from the input signal mix to produce sum and difference frequencies which did not exist in the input signal. It is the result of the behavior of amplifier components when operating outside the linear region.

Where a radio-frequency LPA is comprised of metal oxide semiconductor field effect transistors (MOSFET), it is commonly known that the transconductance of these devices exhibit a pinching off or limiting effect at moderate drain currents as opposed to MOSFET devices designed for high power switching and lower frequency applications. This is due to the fact that in order to achieve the high frequency performance necessary in RF applications, the channel width of each cell within the MOSFET must be substantially reduced. This channel width reduction causes the pinching off effect as the gate potential of the device is increased. This premature current limiting action produces a soft compression, which limits the power output linearity of MOSFET-based LPAs. Additionally, the transconductance prior to limiting is a non-linear function so the small signal gain of the device is strongly affected by the bias current.

Therefore, a RF linear power amplifier is desired which has substantially linear characteristics, minimizes both sideband spillover and intermodulation distortion, and does not increase the DC current consumption over conventional LPAs.

BRIEF DESCRIPTION OF THE DRAWINGS

FIG. 2 is a table showing the quiescent current as a function of three of the four gate voltages shown in FIG. 1.

DETAILED DESCRIPTION OF THE INVENTION

The present invention provides a method and apparatus to improve the linearity of multi-stage RF power amplifiers by tuning each stage, according to the optimization technique disclosed herein, in such a manner that the linearity of the cascaded stages is superior to any single stage by itself.

Figure 1:
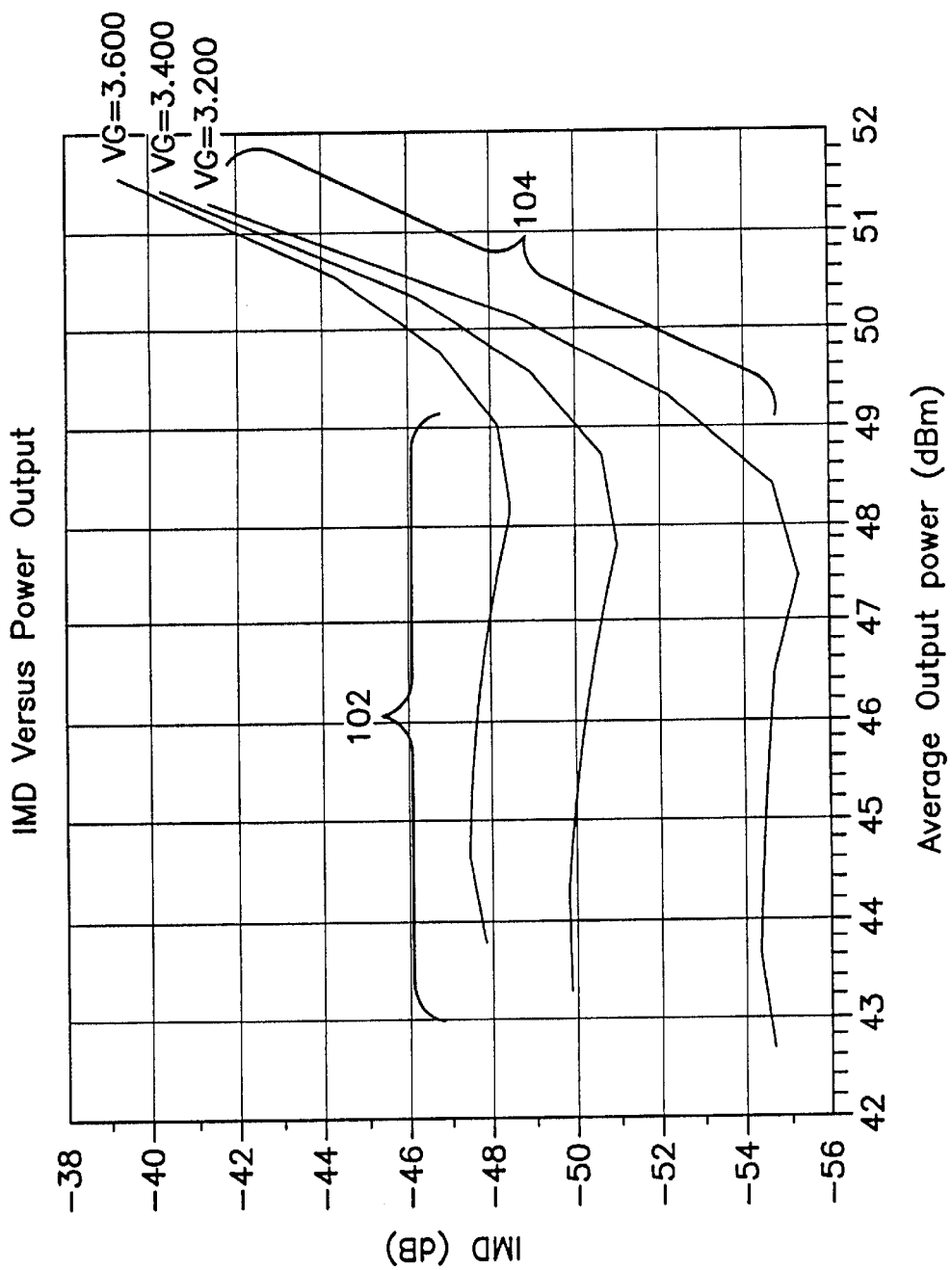
FIG. 1 illustrates a simulated non-linear model of a power amplifier showing the gain as a function of input power and gate voltage.

FIG. 1 illustrates a simulated non-linear model of a power amplifier showing the gain (average power output) versus third order IMD as a function of input power and gate voltage. In FIG. 2, a table shows the predicted quiescent current as a function of the gate voltages. Three of the values in FIG. 2 correspond to the curves illustrated in FIG. 1. While FIGS. 1 and 2 disclose a set of values for purposes of illustrating the invention, the present invention is not limited by these values. The invention may be practiced by the method and apparatus disclosed herein, with numerous other values as may be obtained by someone of ordinary skill in the art.

As seen in FIG. 1, depending on the bias setting, the amplifier gain at low power is greatly affected by the quiescent current level (illustrated in FIG. 2) while the gain at higher power levels is affected to a lesser degree. Upon closer observation, it can be noted that at a particular quiescent current (illustrated in FIG. 2), the amplifier exhibits a region 102 where the gain is somewhat constant (linear) with input power. This would be the theoretical best operating point for optimum linearity.

However, it is clearly visible that the optimum region for constant gain 102 is not the region of maximum output power 104. In conventional power amplifier implementations, some compromise had to be made between highest output power and best linearity.

Figure 3:
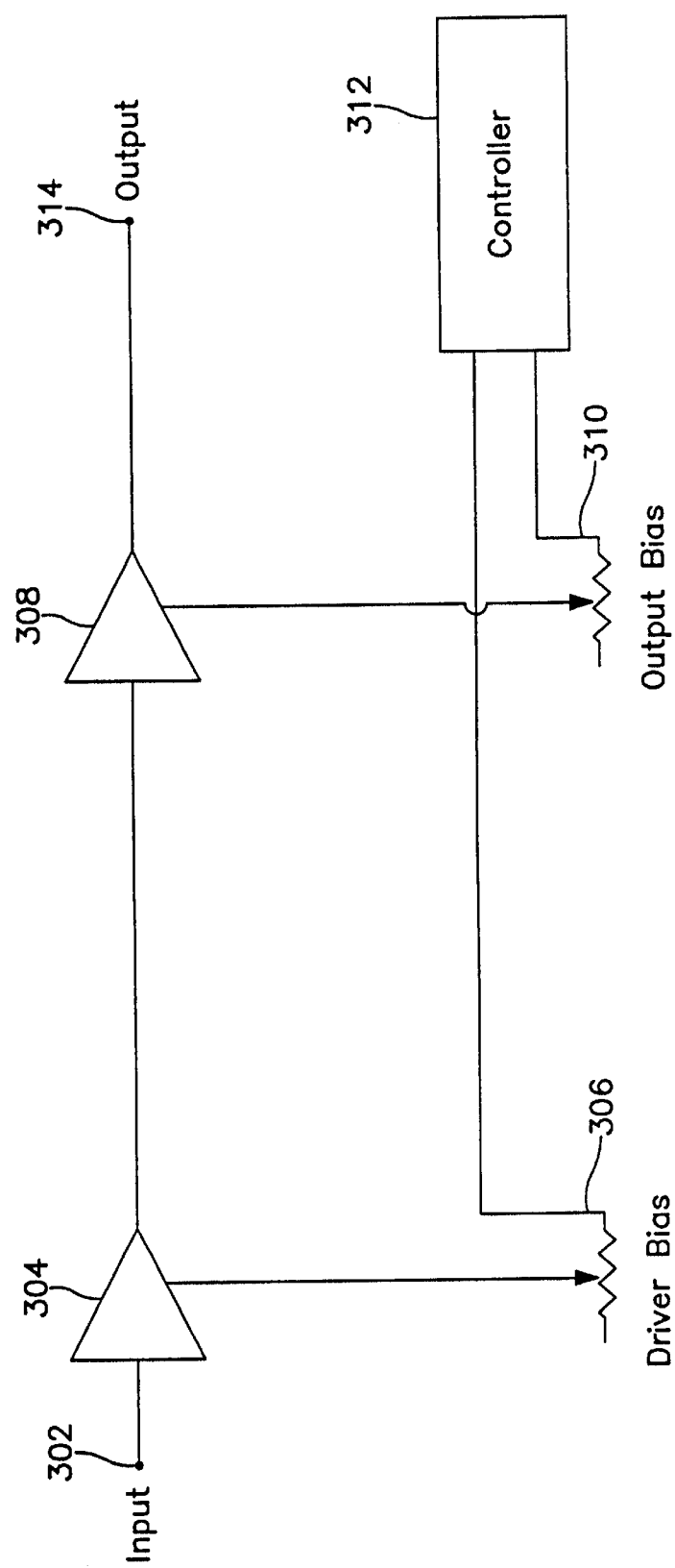
FIG. 3 is a component-level illustration of a first embodiment of the present invention.

FIG. 3 shows one embodiment of the present invention where the RF power amplifier comprises a first stage (driver or input stage) amplifier 304 coupled to a second stage (output stage) amplifier 308. According to a first embodiment of the invention, a controller 312 adjusts the bias voltage 306 to the first stage amplifier 304 for best linearity and adjusts the bias voltage 310 to the second stage amplifier 308 for maximum peak power. As shown in FIG. 1, the best linearity may be achieved by providing the amplifier with a bias voltage which makes it operate within the linear region 102 (FIG. 1). Similarly, the maximum peak power may be achieved by providing the amplifier a bias voltage which makes it operate within the highest power levels 104 (FIG. 1).

This technique achieves improved linearity and lower IMD than present at any one stage of the amplifier. This improvement occurs because the distortion contributed by the first stage is no longer subsequently amplified in the second stage. Rather, the distortion is cancelled out to a substantial degree via the resulting cross cancellation effect of the phase and amplitude distortion normally generated stage to stage. That is, because distortion components from an expansion stage and a compression stage are 180° off, the distortion components within a signal will be substantially cancelled in cascaded stages comprising an expansion and a compression stage.

Compression is defined as a decreasing gain with increasing output power as opposed to expansion where the gain increases as the power output increases. "Soft compression" is defined as a slowly decreasing gain with increasing output power. "Hard compression" is defined as a substantially constant gain until saturation is reached.

Thus, in one configuration the gain expansion of a first stage compensates for the gain compression of a second stage resulting in substantial cancellation of the distortion components. A first stage (driver stage) operates with a bias voltage between the lowest or second lowest levels, i.e. 3.0 Volts DC and 3.2 Volts DC in FIG. 2. This causes the first stage to operate in an area of gain expansion. The second stage amplifier operates with a bias voltage between the highest or second highest level, i.e. 3.6 Volts DC and 3.4 Volts DC in FIG. 2. The resulting power transfer function of the second amplifier would contain soft compression.

In another configuration, the gain compression of a first stage compensates for the gain expansion of the second stage.

According to one embodiment of the invention, the power amplifier comprises RF MOSFETs devices that have similar or an identical die type. For instance, in FIG. 3 the first stage 204 and second stage 208 may comprise RF MOSFET devices of similar die type. In another embodiment, the power amplifier may be comprised of one or more RF lateral diffusion metal oxide semiconductor (LDMOS) power transistors.

Figure 4:
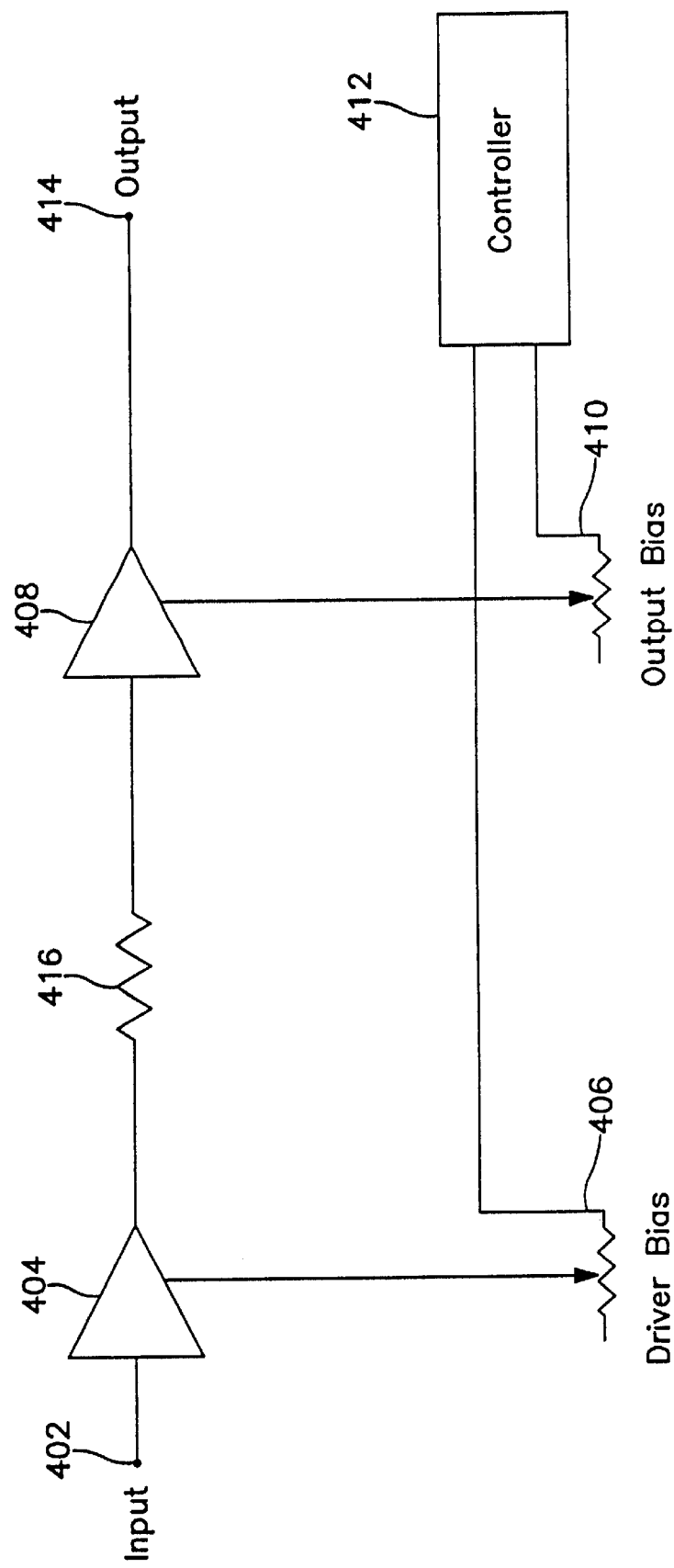
FIG. 4 is a component-level illustration of a second embodiment of the present invention.

In another embodiment of the invention, shown in FIG. 4, in addition to adjusting the bias levels, an attenuator 416 may be placed between a first stage 404 and a second stage 408 to allow the RF operating point of the first stage amplifier 404 to be set for optimal overall linearity enhancement. The second stage amplifier 408 may be biased at a relative low quiescent current for best efficiency and the highest peak power output. The resulting power transfer function would contain gain expansion at low signal levels and some compression at high power levels.

In general, the driver stage may be biased at a relative high bias current that will produce a gain compression effect over a considerable dynamic range. The overall improvement using this biasing linearizing technique can be a reduction in adjacent channel power of as much as 8 to 10 dB versus conventional biasing techniques. All of this improvement is obtained without sacrificing the peak or average output power of the amplifier.

Figure 5:
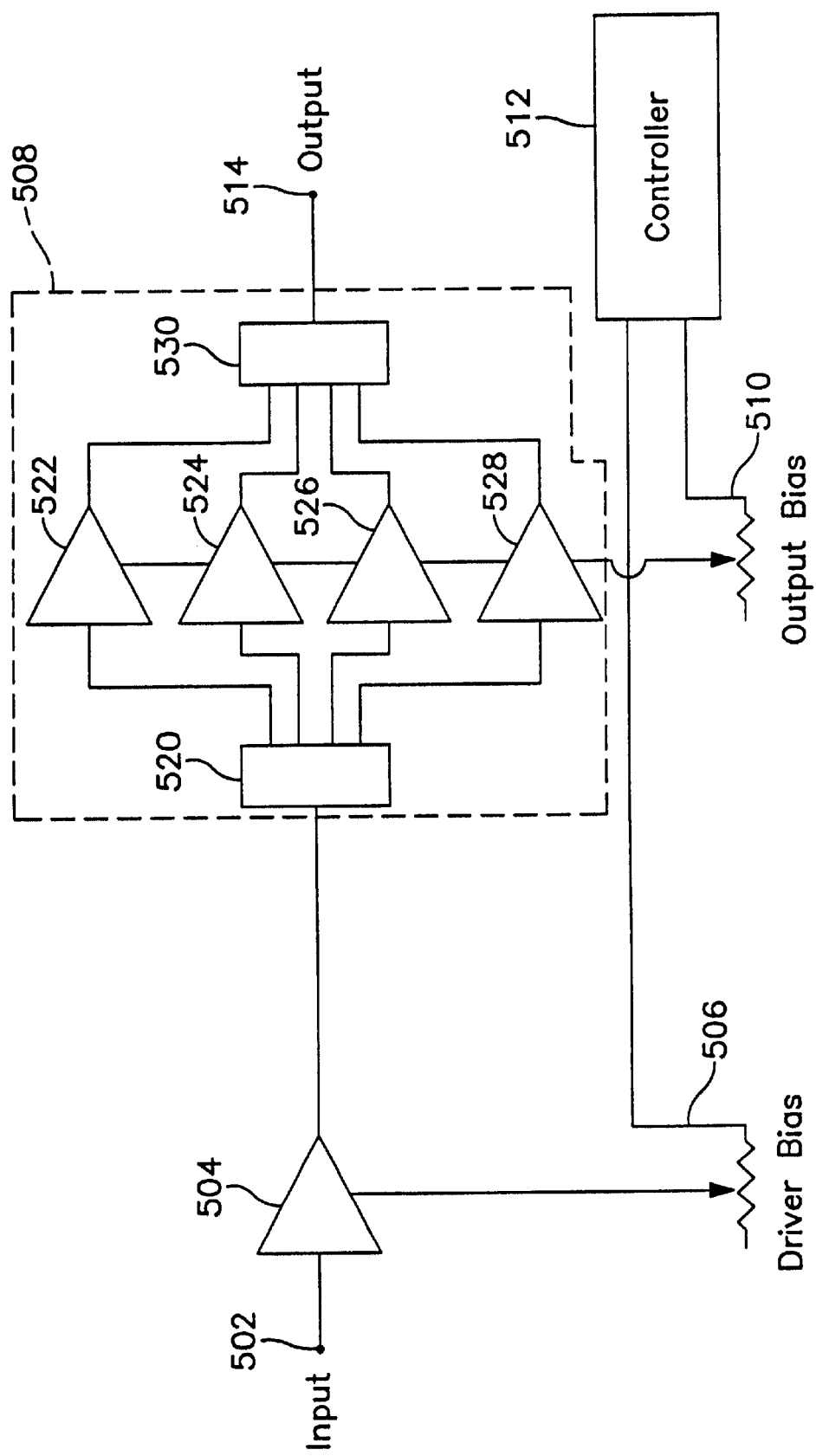
FIG. 5 is a component-level illustration of a third embodiment of the present invention.

According to one embodiment of the invention, a stage may comprise a plurality of output devices. FIG. 5 illustrates a first stage 504 followed by a second stage 508 which comprises a plurality of output devices 522, 524, 526, and 528.

To improve the performance further, stagger biasing of the output devices 522, 524, 526, and 528 can further improve the adjacent channel power. Each output device 522, 524, 526, and 528 may be biased at a slightly different operating or quiescent point. Each output device may comprise at least one amplifier which may include at least one transistor. This type of operation tends to linearize the gain of the output stage 508 since the output devices 522, 524, 526, and 528 are not all compressing at the same power level. Stagger tuning of the bias of the output device can add an additional 1 to 3 dB of adjacent band power reduction.

Figure 6:
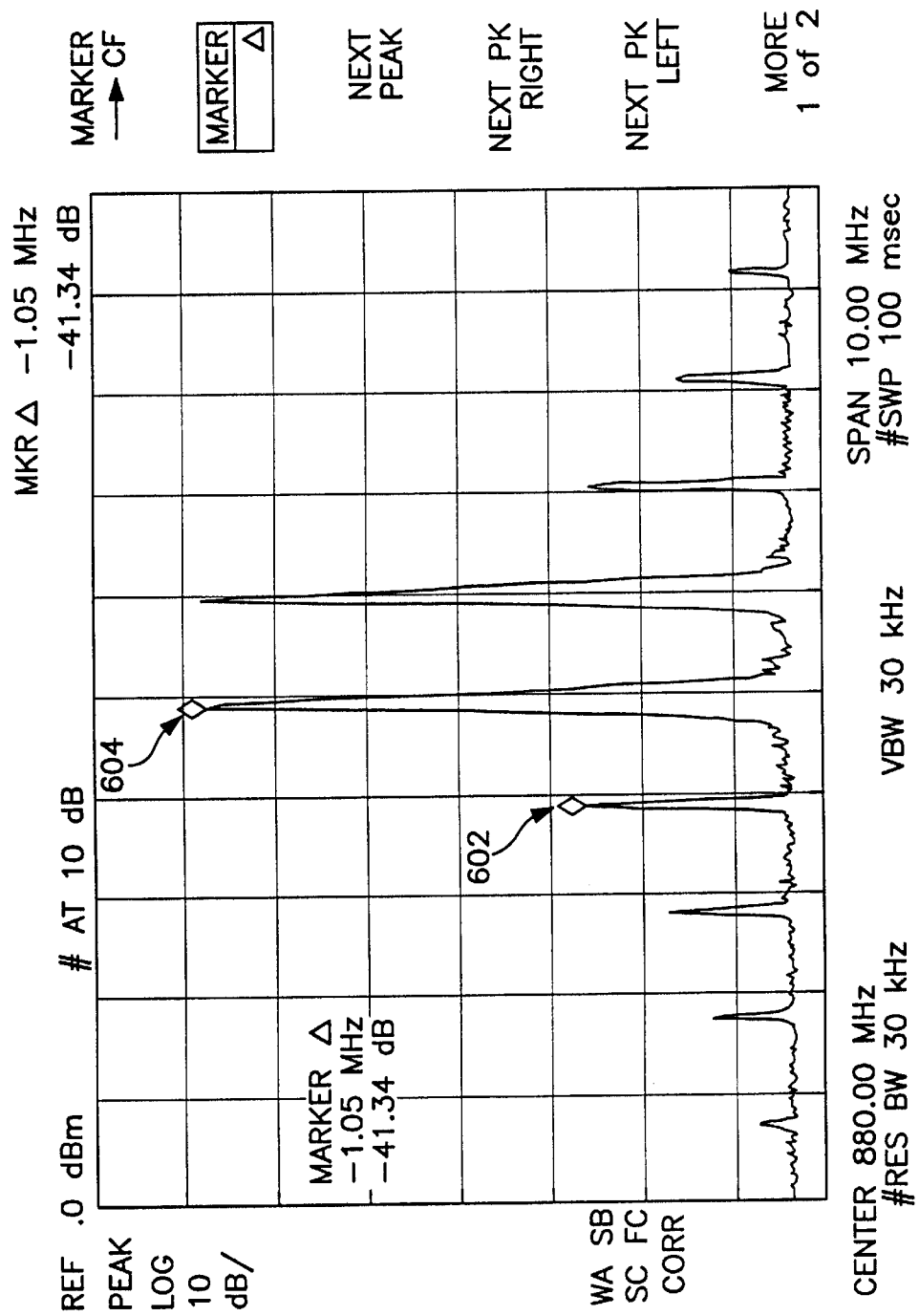
FIG. 6 is an illustration of the output signal power spectrum a multi-stage RF power amplifier.
Figure 7:
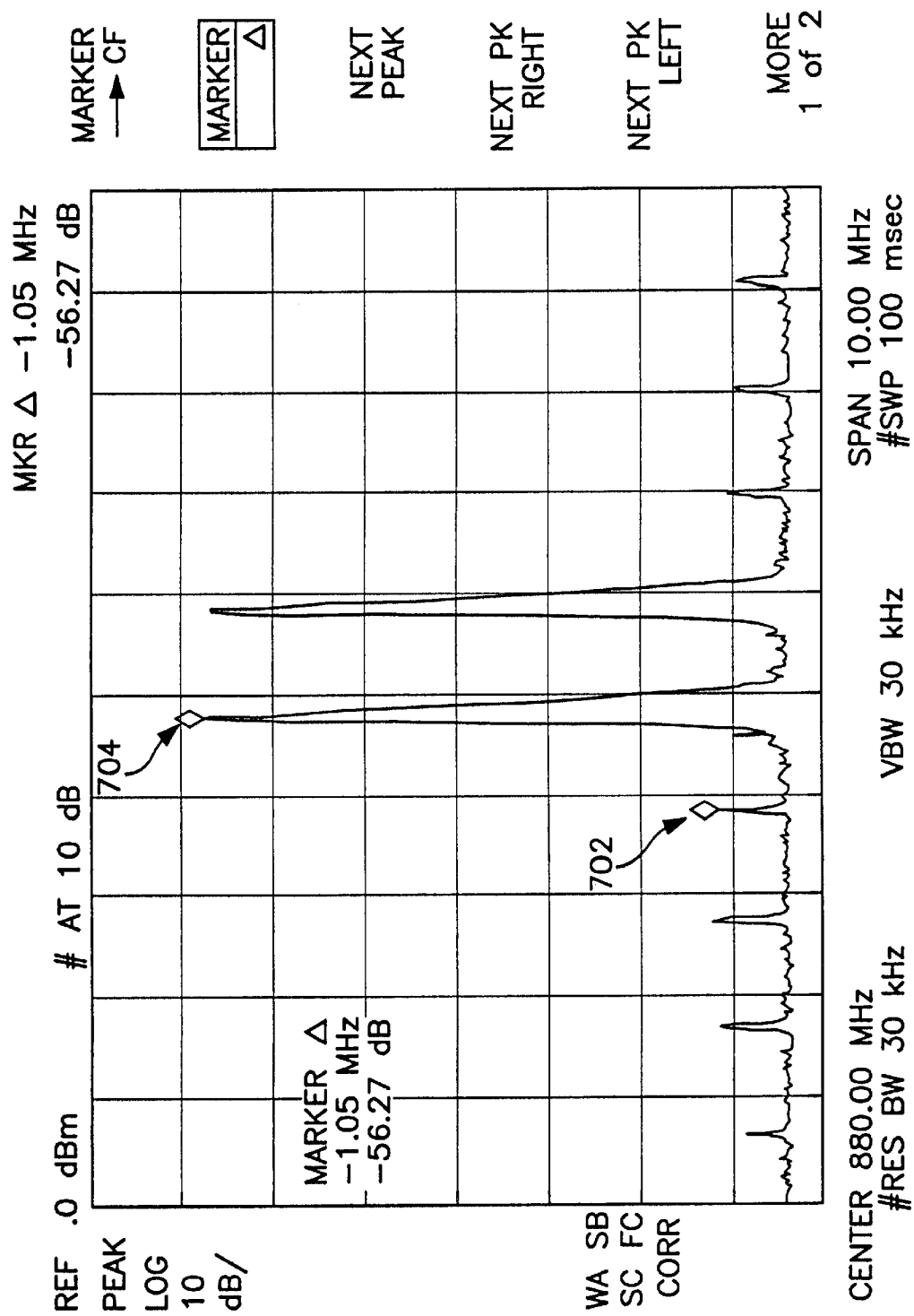
FIG. 7 is an illustration of the output signal power spectrum a multi-stage RF power amplifier when supplemented by the present invention.

FIGS. 6 and 7 illustrate the improvement in performance achieved by the present invention. FIG. 6 is an illustration of the output signal power spectrum a conventional multi-stage RF power amplifier not employing the present invention. Note the intermodulation distortion measured from the center frequency 604 to the first side-band 602 is −41.34 dB. FIG. 7 is an illustration of the output signal power spectrum a multistage RF power amplifier employing cascaded stages comprising an expansion and a compression stage. Note that the intermodulation distortion measured from the center frequency 704 to the first side-band 702 is −56.27 dB. This is an improvement of almost 15 dB in intermodulation distortion of the output signal.

Figure 8:
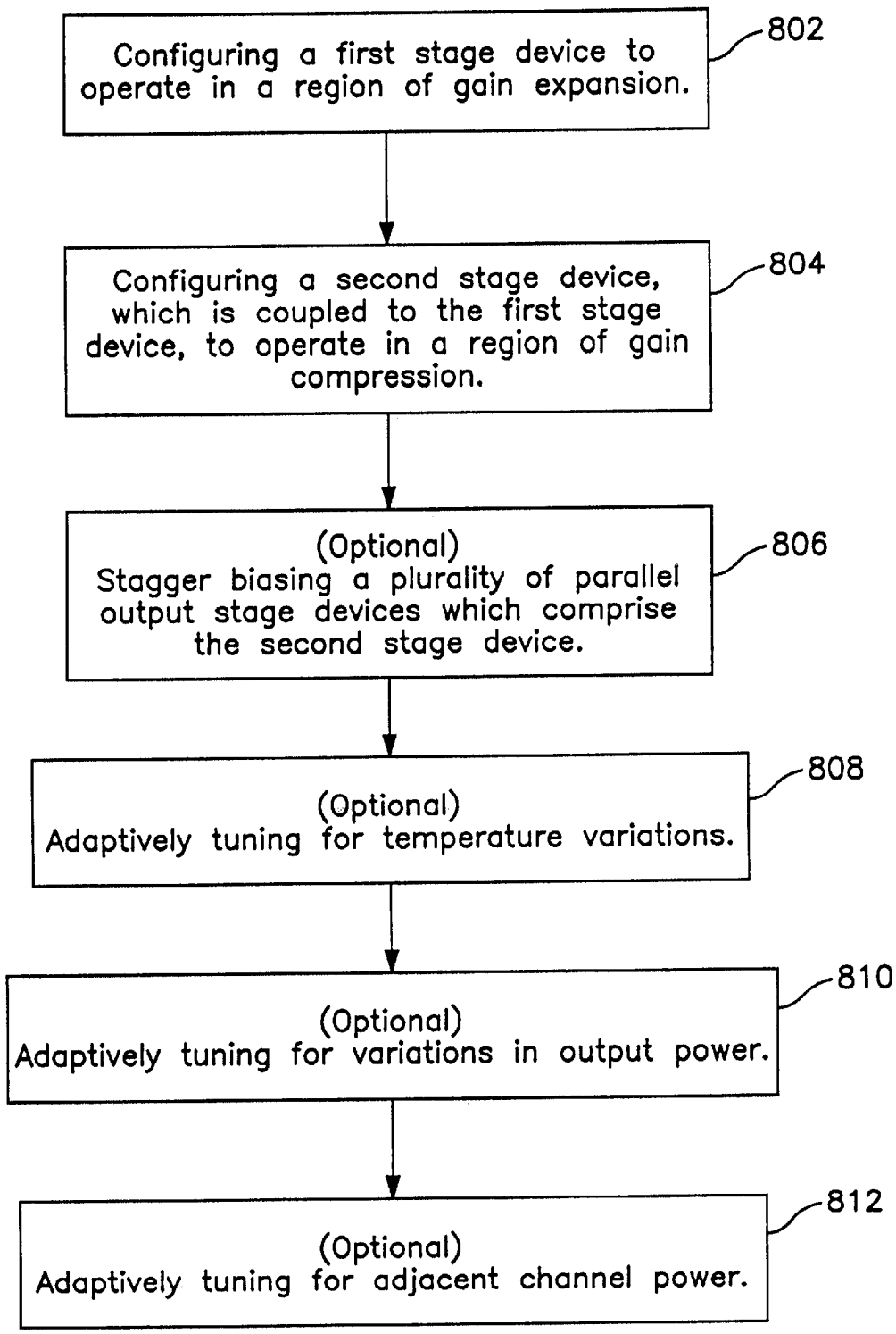
FIG. 8 is an illustration of the steps to practice the invention.

FIG. 8 illustrates the process by which the invention may be practiced. A first stage device (driver or input stage) may be configured to operate in a region of gain expansion 802. A second stage device (output stage), coupled to the first stage device, may be configured to operate in a region of gain compression 804. One way in which these devices may be configured is to set the quiescent current of the first stage device to a low level to obtain gain expansion while setting the quiescent current of the second stage device to a relative high level to obtain reduction in adjacent channel power.

Another embodiment of this process can be realized by reversing this biasing technique. That is, to set the quiescent current of the first stage to a relative high level to obtain gain compression. The second stage's quiescent current would then be set at a relative high low level.

In another embodiment, where the second stage device comprises a plurality of output devices in parallel, the output devices may be and staggered biased 806 (FIG. 8).

Since it is a well established fact that the VTO (turn on threshold) of MOSFET changes with temperature and the above techniques relies heavily on quiescent current it is advantageous to maintain optimum performance by monitoring the base plate temperature of the amplifier and using a digital look up table to adjust the bias to maintain optimum linearity over temperature variations as high as 100 degrees Celsius.

Digital power amplifier requirements usually dictate the use of dynamic control of the power level over at least a 10 dB range. It has been found empirically that making slight bias adjustments as the power output is varied over a wide dynamic range can further optimize this linearization technique.

In order to accommodate the need to optimize the operating bias for both temperature variations 808 (FIG. 8) and power variations 810 (FIG. 8), a small microprocessor in conjunction with a look up table (memory) can easily accomplish adaptive control of the amplifier. The same processor can perform other functions such as reporting faults, status reports, and module interface communications.

In another embodiment, the bias tuning process may be adaptively controlled by utilizing a digitally tuned receiver. This receiver is scanned across the operating band to find one or more carrier frequencies. Once the carrier frequencies are identified, the receiver can be programmed to measure the adjacent channel power of the carriers and choose the highest adjacent channel power. A software-minimizing algorithm may be used to adjust the bias levels to reduce the adjacent channel power to acceptable levels 812 (FIG. 8).

In one embodiment of the present invention, the tuning process may be accomplished by maintaining a fixed relationship between the bias levels of a first and second stage. For instance, the bias level of a first stage may be consistently maintained at approximately half the bias level of a second stage. In another embodiment, the bias level of the second stage may be maintained at approximately sixty percent the bias level of the first stage. These relationships are provided by way of illustration only and are not limitations upon the present invention which may be practiced with other bias level ratios between the first and second stages of a power amplifier.

While the invention has been described and illustrated in detail, it is to be clearly understood that this is intended by way of illustration and example only and is not to be taken by way of limitation, the spirit and scope of this invention being limited only by the terms of the following claims.

What is claimed is:

1. A cascaded multi-stage power amplifier, comprising:
a first stage amplifier biased to operate in a region of gain expansion; and
a second stage amplifier coupled to the first stage amplifier and biased to operate in a region of gain compression, the second stage including a plurality of amplifiers in a parallel configuration, the plurality of amplifiers being biased at different operating points selected to reduce adjacent band power.

2. The power amplifier of claim 1, wherein the power amplifier is a radio frequency amplifier.

3. The power amplifier of claim 1, wherein the power amplifier includes at least one lateral diffusion metal oxide semiconductor power transistor.

4. The power amplifier of claim 1, wherein the cascaded first and second stage amplifiers exhibit a more linear gain than either stage alone.

5. The power amplifier of claim 1, wherein the intermodulation distortion of the cascaded first and second stage amplifiers is less than the intermodulation distortion of either stage alone.

6. The power amplifier of claim 1, further comprising at least one controller circuit to bias the first stage and second stage amplifiers.

7. The power amplifier of claim 6, further comprising a memory store, wherein the at least one controller sets the bias to the first stage according to values found in the memory store.

8. The power amplifier of claim 1, wherein the first stage amplifier is adaptively biased as the output of the power amplifier is varied.

9. The power amplifier of claim 1, wherein the first stage amplifier is adaptively biased to compensate for temperature variations of the power amplifier.

10. A method to minimize intermodulation distortion and reduce adjacent band power of a multi-stage power amplifier, comprising:
biasing a first stage amplifier to operate in a region of gain expansion; and
biasing a second stage amplifier, which is coupled to the first stage amplifier, to operate in a region of gain compression, the second stage amplifier having a plurality of amplifiers in a parallel configuration, the biasing including biasing the plurality of amplifiers of the second stage at different operating points selected to reduce adjacent band power.

11. The method of claim 10 wherein biasing the first and second stage amplifiers results in a more linear gain than either stage alone.

12. The method of claim 10, wherein the intermodulation distortion of the cascaded first and second stage amplifiers is less than the intermodulation distortion of either stage alone.

13. The method of claim 10, wherein the amplifier is a radio frequency amplifier.

14. The method of claim 10, wherein the power amplifier includes at least one lateral diffusion metal oxide semiconductor power transistor.

15. The method of claim 10, wherein the first and second stage amplifiers exhibit a more linear gain than either stage alone.

16. The method of claim 10, wherein biasing the first amplifier is accomplished according to values found in a memory store.

17. The method of claim 10, further comprising:
adaptively biasing the first stage amplifier as the output of the power amplifier is varied.

18. A cascaded multi-stage power amplifier, comprising:
a first stage amplifier; and
a second stage amplifier coupled to an output of the first stage amplifier, the second stage including a plurality of amplifiers in a parallel configuration, the plurality of amplifiers being biased at different operating points selected to reduce adjacent band power.

19. A cascaded multi-stage power amplifier, comprising:
an RF base station amplifier having:
  a first stage amplifier; and
  a second stage amplifier coupled to an output of the first stage amplifier, the second stage including a plurality of amplifiers in a parallel configuration, the plurality of amplifiers being biased at different operating points selected to reduce adjacent band power.

20. A method of reducing adjacent band power output of a cascaded multi-stage power amplifier comprising:
  providing an output stage for the power amplifier having a plurality of amplifiers coupled in parallel; and,
  biasing the plurality of amplifiers at different operating points selected to reduce adjacent band power.

21. A method of reducing adjacent band power output of a cascaded multi-stage RF base station power amplifier comprising:
  providing an output stage for the RF base station power amplifier having a plurality of amplifiers coupled in parallel; and,
  biasing the plurality of amplifiers at different operating points selected to reduce adjacent band power.

* * * * *